US009059383B2

(12) United States Patent
Wortley et al.

(10) Patent No.: US 9,059,383 B2
(45) Date of Patent: Jun. 16, 2015

(54) HAND HELD BREAST PUMP

(75) Inventors: Mark John Wortley, Sudbury (GB); Roger Leonard Williams, Broxbourne (GB); Edward Atkin, London (GB)

(73) Assignee: KONINKLIJKE PHILIPS N.V., Eindhoven (NL)

( * ) Notice: Subject to any disclaimer, the term of this patent is extended or adjusted under 35 U.S.C. 154(b) by 1575 days.

(21) Appl. No.: 11/912,858

(22) PCT Filed: Apr. 28, 2006
(Under 37 CFR 1.47)

(86) PCT No.: PCT/EP2006/061946
§ 371 (c)(1),
(2), (4) Date: Jan. 15, 2010

(87) PCT Pub. No.: WO2006/117352
PCT Pub. Date: Nov. 9, 2006

(65) Prior Publication Data
US 2010/0174232 A1    Jul. 8, 2010

(30) Foreign Application Priority Data
Apr. 29, 2005    (EP) .................................... 05103588

(51) Int. Cl.
| A61M 1/06 | (2006.01) |
| H01L 33/58 | (2010.01) |
| H01L 25/075 | (2006.01) |
| H01L 33/54 | (2010.01) |
| H01L 33/64 | (2010.01) |

(52) U.S. Cl.
CPC ............. *H01L 33/58* (2013.01); *H01L 25/0753* (2013.01); *H01L 33/54* (2013.01); *H01L 33/64* (2013.01); *H01L 2924/0002* (2013.01)

(58) Field of Classification Search
CPC ................... H01L 2924/0002; H01L 25/0753; H01L 2924/00; H01L 33/54; H01L 33/58; H01L 33/64; A61M 1/06; A61M 2001/0068; A61M 2205/073
USPC ........................................................... 604/74
See application file for complete search history.

(56) References Cited

U.S. PATENT DOCUMENTS

| 4,759,747 | A | * | 7/1988 | Aida et al. ...................... 604/74 |
| 4,813,932 | A | * | 3/1989 | Hobbs ............................. 604/74 |
| 5,571,084 | A | | 11/1996 | Palmer |
| 5,947,923 | A | * | 9/1999 | Uehara et al. .................. 604/74 |
| 6,673,036 | B1 | * | 1/2004 | Britto .............................. 604/74 |
| 7,479,125 | B2 | * | 1/2009 | Tashiro ........................... 604/74 |
| 7,641,629 | B2 | * | 1/2010 | Yuen .............................. 604/74 |
| 2002/0183717 | A1 | * | 12/2002 | Morton et al. ................ 604/514 |
| 2003/0204164 | A1 | * | 10/2003 | Britto et al. ..................... 604/74 |
| 2004/0087898 | A1 | * | 5/2004 | Weniger ......................... 604/74 |
| 2004/0158199 | A1 | * | 8/2004 | McKendry et al. ............. 604/74 |
| 2005/0068459 | A1 | | 3/2005 | Holmes |
| 2011/0034869 | A1 | * | 2/2011 | Greter et al. .................... 604/74 |

FOREIGN PATENT DOCUMENTS

| DE | 10132516 | 1/2003 |
| EP | 733376 | 6/1996 |
| EP | 1502610 | 2/2005 |
| JP | 9038199 A | 2/1997 |
| WO | 0147577 A2 | 7/2001 |

* cited by examiner

*Primary Examiner* — Jason Flick

(57) ABSTRACT

A hand held breast pump comprises a powered head (1), a body (7) including a diaphragm pump, a breast engaging portion (23) and a bottle coupling (24). The powered head (1) may be exchangeable for a manual head (4).

13 Claims, 13 Drawing Sheets

HAND HELD BREAST PUMP

The present invention relates to a hand held powered breast pump and a hand held breast pump system.

WO-A-01/47577 discloses a programmable powered breast pump apparatus. The disclosed breast pump apparatus is programmed by recording control data on or in a data carrier which is then inserted into the breast pump apparatus. The control data is read from the data carrier and controls the pumping cycle.

The breast pump apparatus disclosed in WO-A-01/47577 suffers from the disadvantage that the programming process is complex.

U.S. Pat. No. 5,571,084 discloses a powered breast pump in which the user has some limited control over the pumping cycle. The limited control that the user has is itself a problem.

EP-A-1502610 discloses a powered breast pump which has learn and run mode of operation.

According to the present invention, there is provided a hand held, powered breast pump comprising:
  a body having a breast-receiving portion and means for attaching a vessel to receive expressed milk;
  piston means, including an actuating element, for effecting pumping; and
  a motor unit including a motor and a driving mechanism for reciprocally driving the piston means,
  wherein the drive mechanism is configured to connect to said actuating element when brought into contact therewith.

The drive mechanism may be configured such that it connects to said actuating element during the process of mounting the motor unit to the body. If the drive mechanism has a crank mechanism, this is preferably with the crank mechanism at its bottom dead centre position and/or such that it connects to said actuating element while being driven through its bottom dead centre position.

Preferably, the drive mechanism is a crank mechanism and includes connecting rod means and said pick up is effected by relative resilient deflection and recovery between the connecting rod means and said actuating element. However, other mechanisms for converting rotary motion into linear motion, e.g. a lead screw mechanism, may be used. The linear motion could be provided using a linear motor rather than a rotary motor.

Preferably, the actuating element is a resiliently deflectable projection projecting from the piston means. However, the resilience may be provided in the connecting rod.

Preferably, the projection has a bulge and the connecting rod means includes means for receiving said bulge so as to couple the connecting rod means and the projection operatively. However, the bulge could be provided on the connecting rod with the means for receiving the bulge being provided on the projection. More preferably, the connecting rod means has a coupling portion shaped to surround the projection partially and the means for receiving the bulge comprises a recess or slot in said coupling portion. Other coupling mechanisms, for instance sprung cleft and magnetic couplings, could be used instead.

Preferably, the piston means comprises a resilient diaphragm but may be a rigid piston. In the case of a diaphragm-type piston means, it is preferable that:
  the drive mechanism is a crank mechanism and includes connecting rod means;
  the actuating element projects from the diaphragm; and
  the connecting rod means is configured such that said connection to said actuating element is effected by the actuating element first being deflected and then recovering, due to the resilience of the diaphragm.

Preferably, a control circuit, configured to effect pumping by alternating the direction of the motor, is included.

The body may include a pumping chamber in which the piston means operates. However, the pumping chamber may be in the motor unit.

The hand held breast pump may be battery powered and, if so, may include a boost regulator for regulating the voltage supplied to the motor.

According to the present invention, there is provided a battery-powered hand held breast pump, including a pump motor and a boost regulator for regulating the voltage supplied to the pump motor.

According to the present invention, there is provided a hand held breast pump system comprising:
  a body, having a breast-receiving portion, and means for attaching a vessel to receive expressed milk; and
  interchangeable manual and motorised actuating units.

Each actuating unit may include a respective pumping chamber, in which case a conduit may be provided for connecting the pumping chamber to the inside of the body. The conduit may comprise a tube which is insertable into an aperture in the body. However, preferably, the body includes a pumping chamber and, more preferably, piston means is provided which is operable in the pumping chamber by both the manual and motorised actuating units.

Preferably, the piston means includes an actuating element, for effecting pumping, the motorised actuating unit includes a motor and a drive mechanism for reciprocally driving the piston means, and the drive mechanism is configured to connect to said actuating element when brought into contact therewith.

The drive mechanism may be configured such that it connects to said actuating element during the process of mounting the motorised actuating unit to the body.

If the drive mechanism has a crank mechanism, this is preferably with the crank mechanism at its bottom dead centre position and/or such that it connects to said actuating element while being driven through its bottom dead centre position.

Preferably, the crank mechanism includes connecting rod means and said pick up is effected by relative resilient deflection and recovery between the connecting rod means and said actuating element.

Preferably, the actuating element is a resiliently deflectable projection projecting from the piston means. However, the resilience may be provided in the connecting rod.

Preferably, the projection has a bulge and the connecting rod means includes means for receiving said bulge so as to couple the connecting rod means and the projection operatively. However, the bulge could be provided on the connecting rod with the means for receiving the bulge being provided on the projection. More preferably, the connecting rod means has a coupling portion shaped to surround the projection partially and the means for receiving the bulge comprises a recess or slot in said coupling portion. Other coupling mechanisms, for instance sprung cleft and magnetic couplings, could be used instead.

Preferably, the piston means comprises a resilient diaphragm but may be a rigid piston. In the case of a diaphragm-type piston means, it is preferable that:
  the drive mechanism is a crank mechanism and includes connecting rod means;
  the actuating element projects from the diaphragm; and
  the connecting rod means is configured such that said connection to said actuating element is effected by the actuating element first being deflected and then recovering, due to the resilience of the diaphragm.

Preferably, a control circuit, configured to effect pumping by alternating the direction of the motor, is included.

The hand held breast pump may be battery powered and, if so, may include a boost regulator for regulating the voltage supplied to the motor.

The motorised actuating unit is preferably battery-powered and, more preferably, includes a boost regulator for regulating the voltage supplied to a motor of the motorised actuating unit.

An embodiment of the present invention will now be described, by way of example, with reference to the accompanying drawings, in which.

Figure 1:
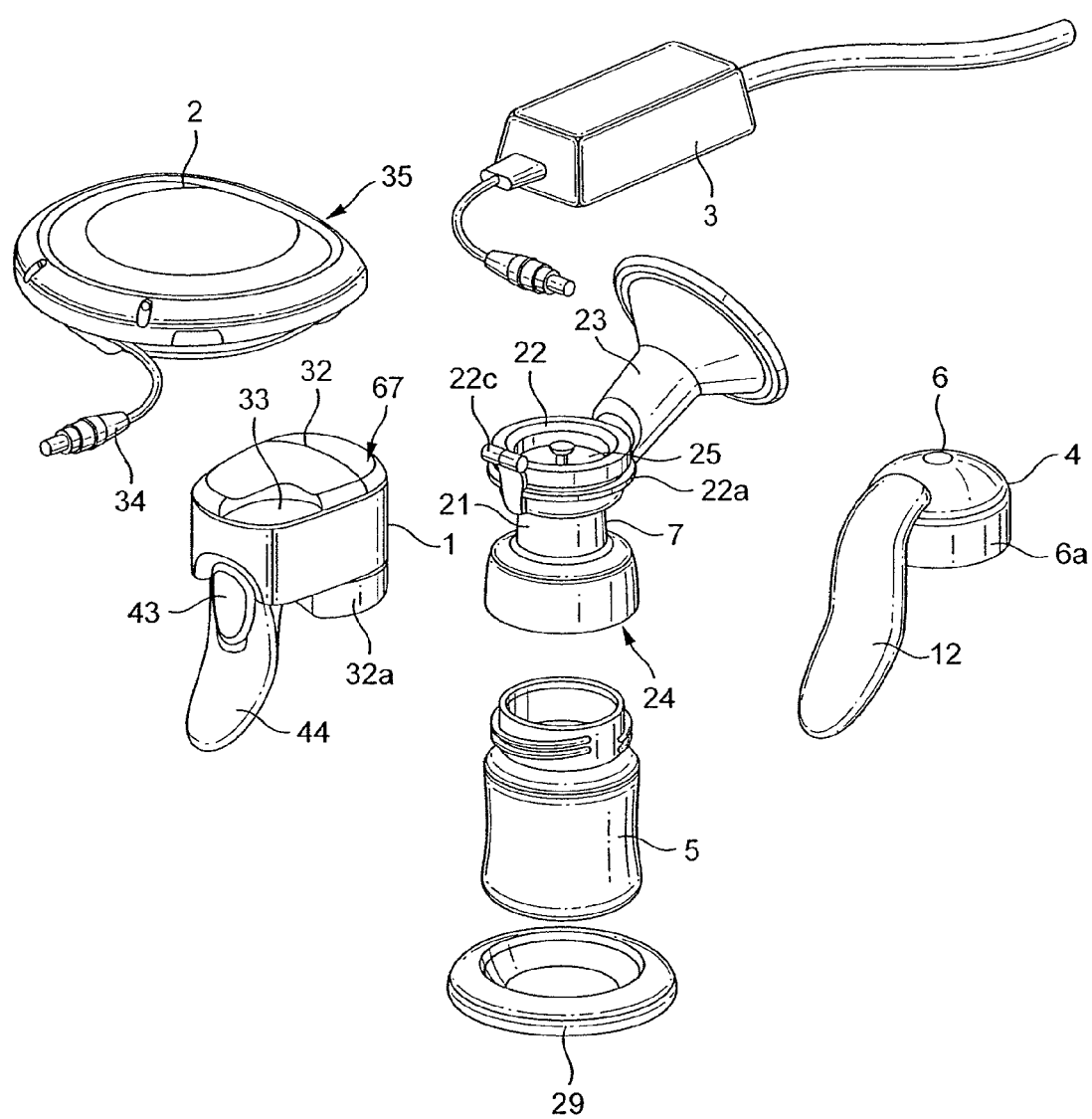
FIG. 1 shows a breast pump system according to the present invention.
Figure 2:
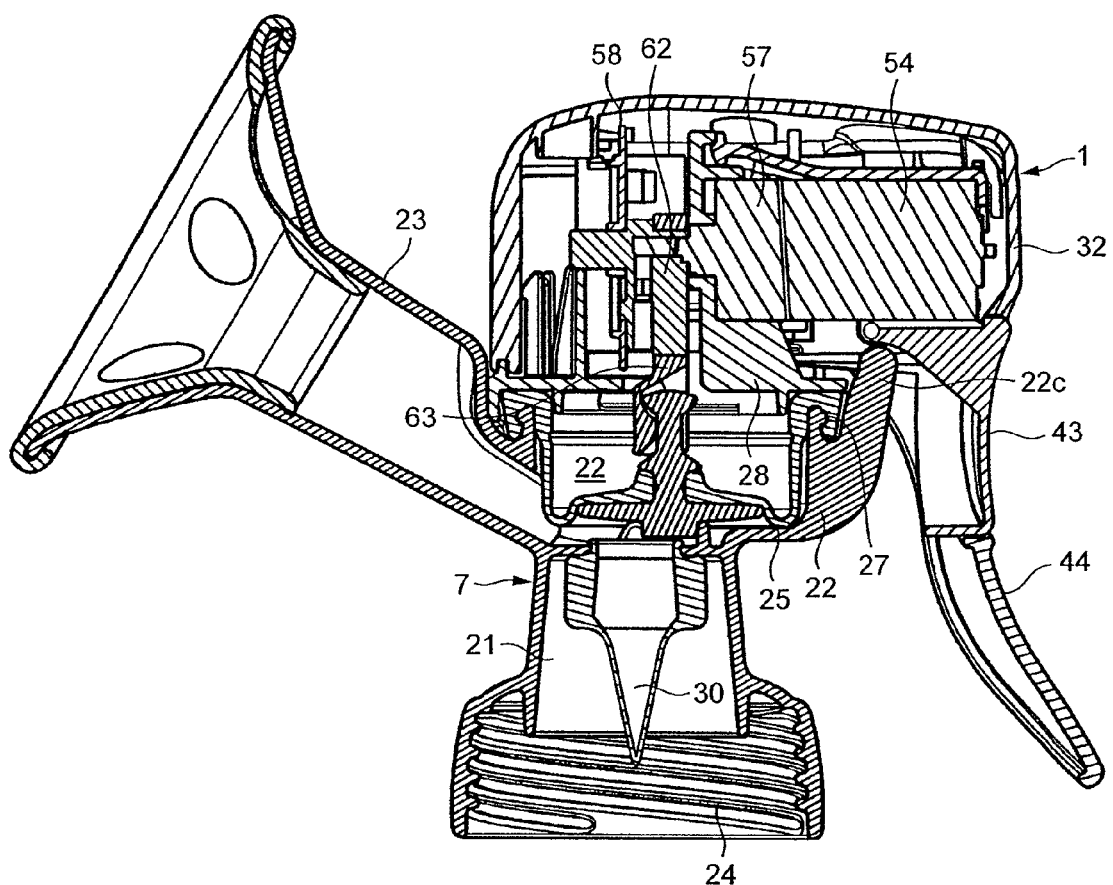
FIG. 2 is a sectional side view of the powered head in FIG. 1 mounted to a body.
Figure 6:
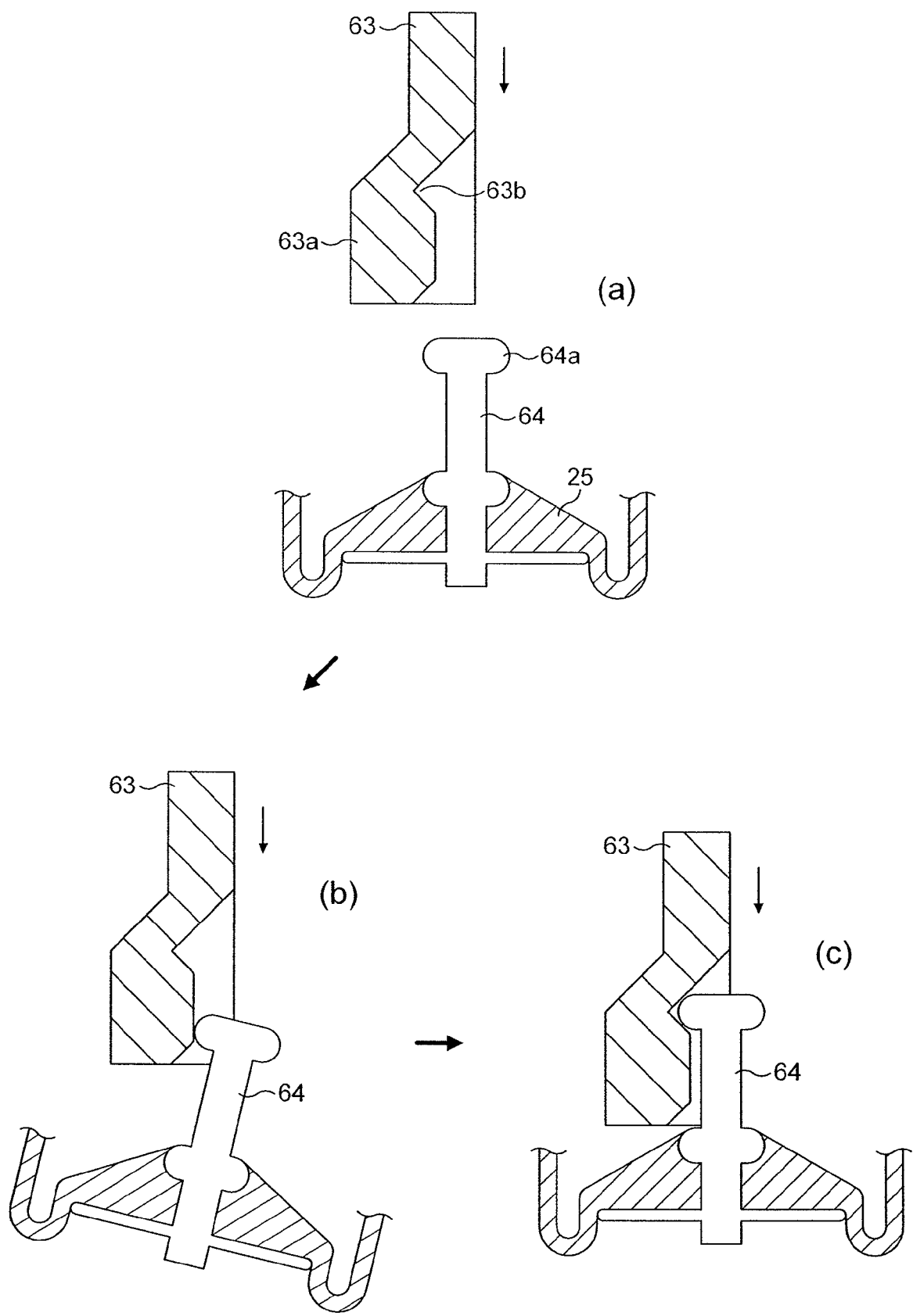
Figure 7:
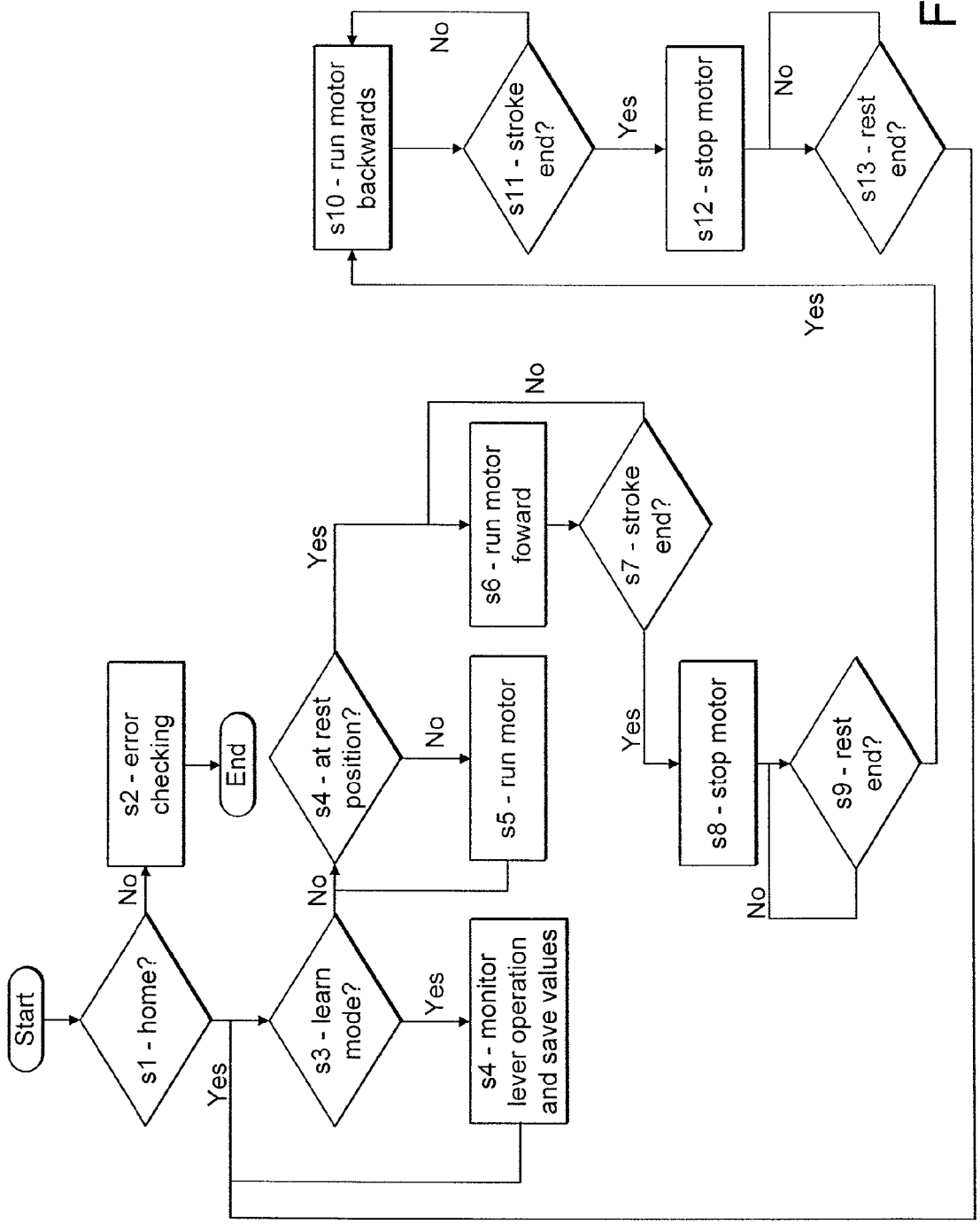
Figure 8:
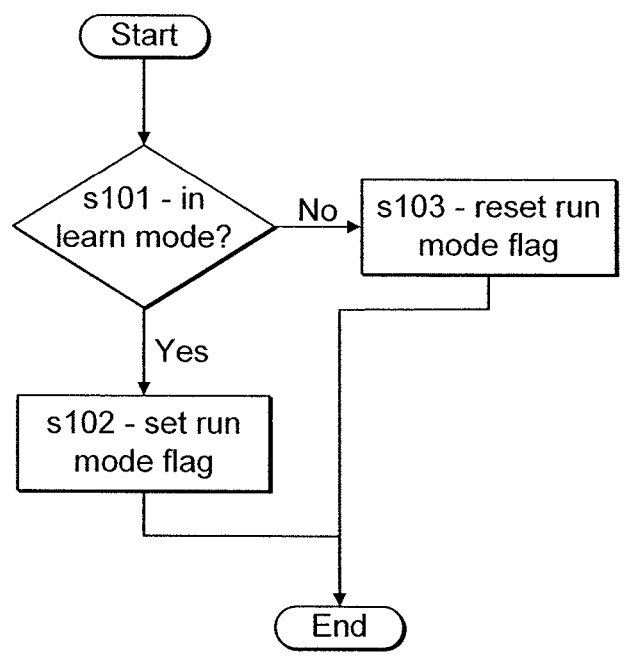
Figure 9:
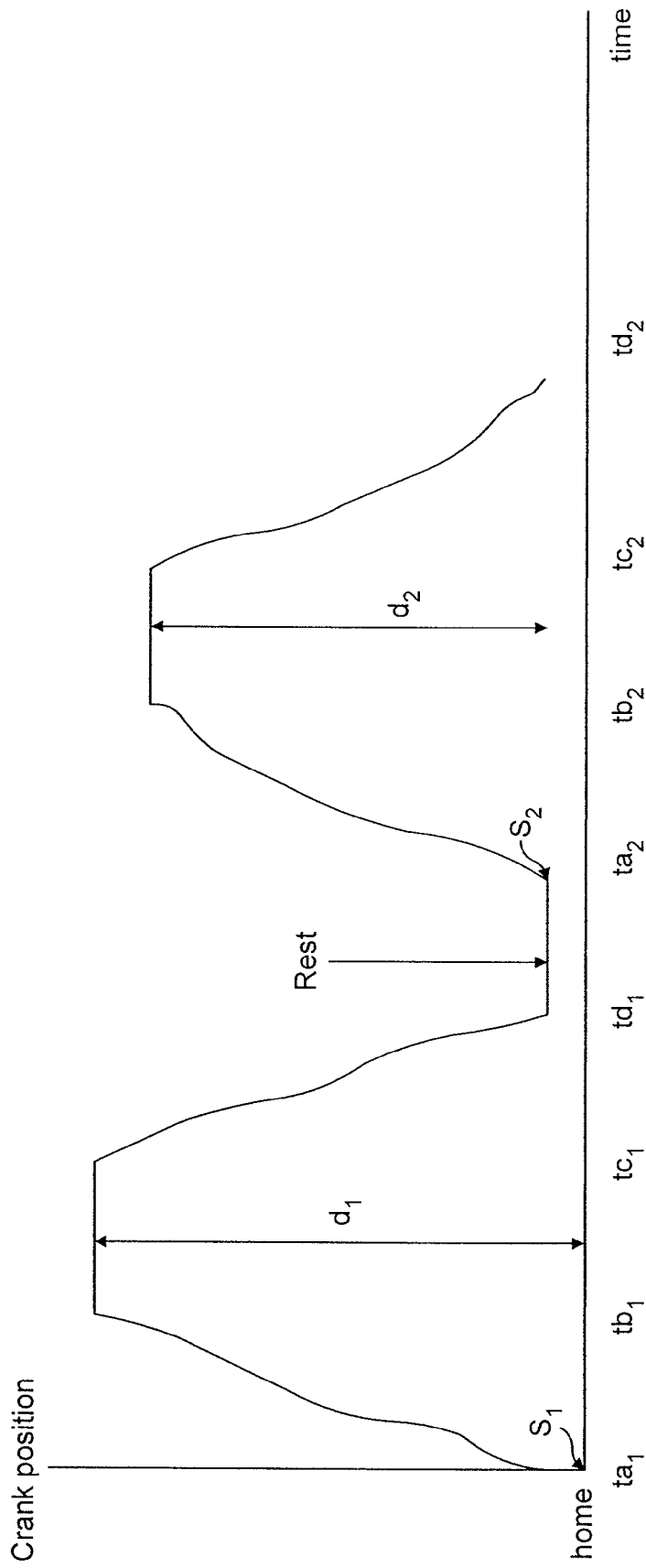
Figure 10:
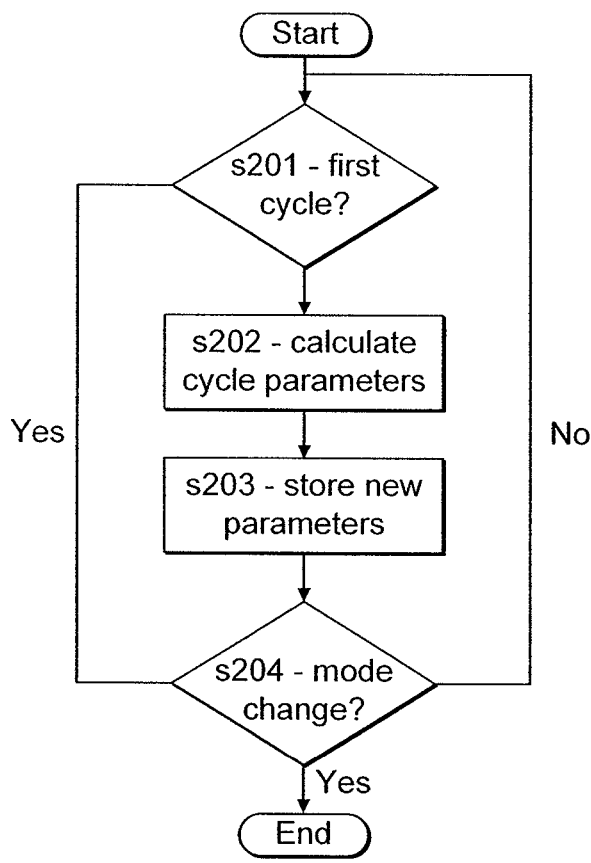
Figure 11:
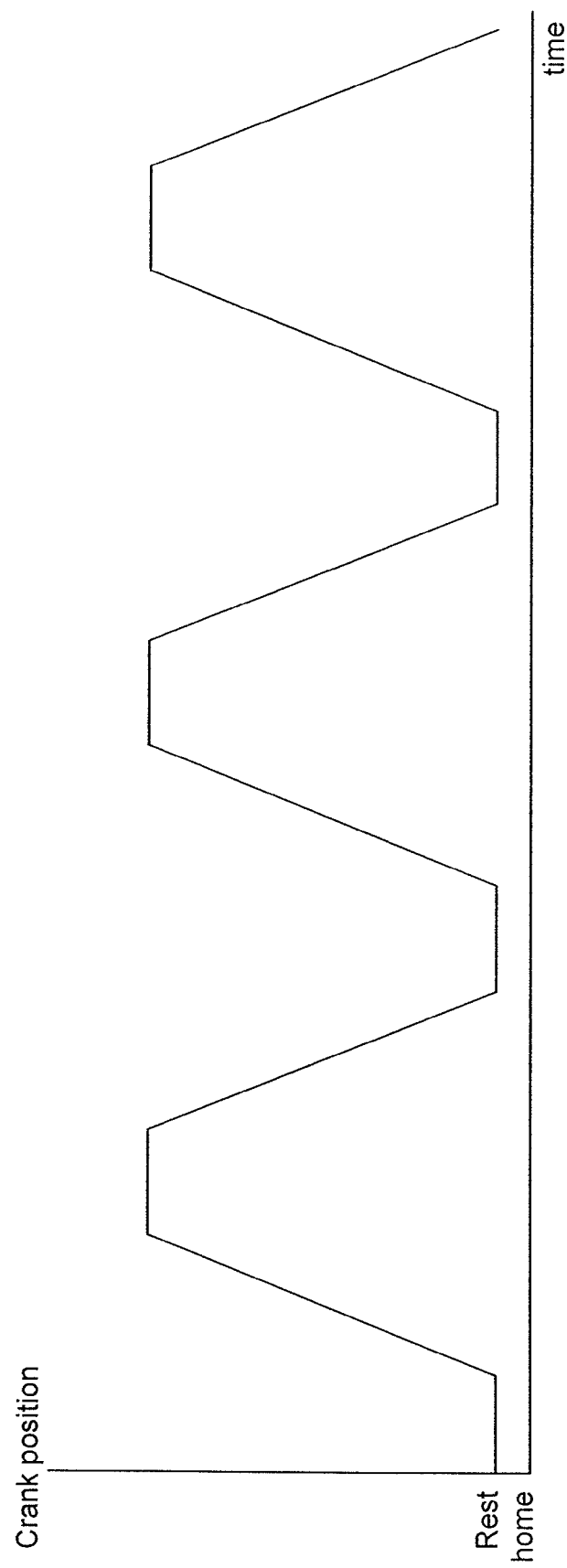
Figure 12:
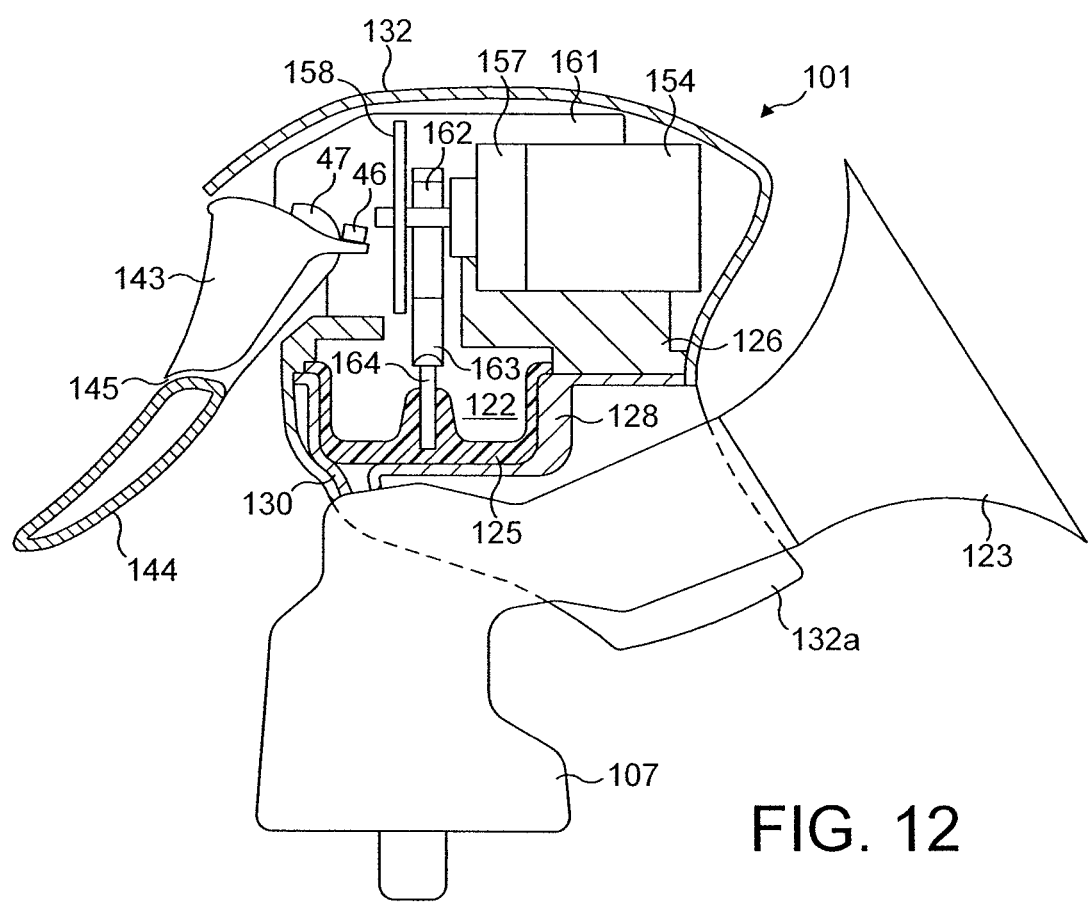
Figure 13:
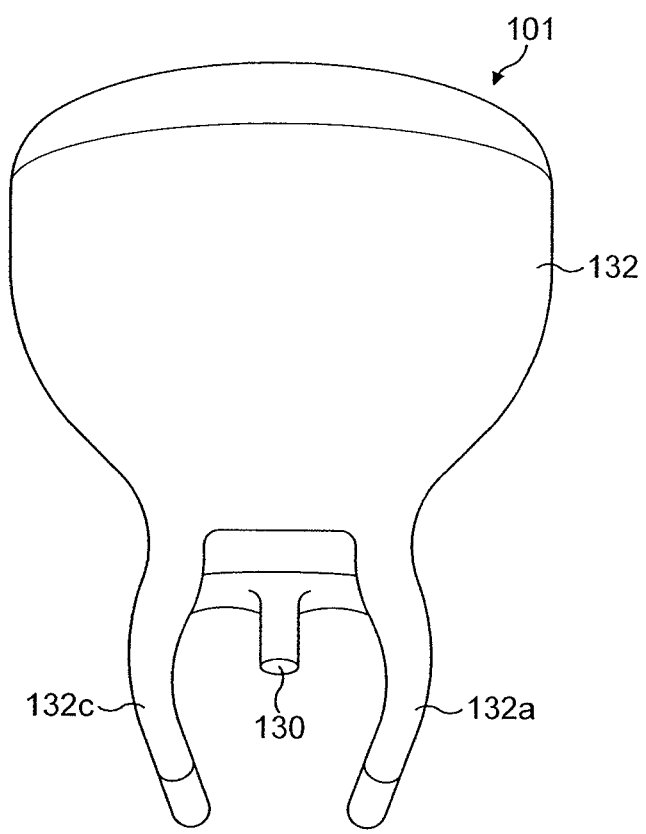

FIGS. 6(a) to 6(c) illustrate the process of connecting the connecting rod of the powered head shown in FIG. 2 to its diaphragm;

FIG. 7 is a flowchart illustrating the operation of the system in FIG. 1;

FIG. 8 is a flowchart illustrating mode changing of the system in FIG. 1;

FIG. 9 is a plot illustrating two exemplary pumping cycles during "learn" mode operation of the system in FIG. 1;

FIG. 10 is a flowchart illustrating part of the "learn" mode operation in detail;

FIG. 11 is a plot illustrating three "run" mode pumping cycles of the system of FIG. 1;

FIG. 12 is a sectional side view of a second powered head according to the present invention; and FIG. 13 is a front view of the second powered head shown in FIG. 12.

Referring to FIG. 1, a breast pump system according to the present invention comprises a powered head 1, a battery pack 2, a mains PSU 3, a manual head 4, a feeding bottle 5, a base 29 for the feeding bottle 5 and a body 7.

The manual head 4, the body 7 and the feeding bottle 5 are very similar to the components of the Avent® ISIS® breast pump product.

The body 7 comprises a neck 21, a cup 22 supported on the neck 21 and a trumpet 23 projecting from the side of the cup 22. The bottom of the neck is flared and provided with an internal thread 24 (see FIG. 2) for screwing the body 7 onto a bottle 5. The trumpet 23 is inclined upwards and, in use, receives the nipple and surrounding breast portion of the user and is sealed thereby. A passageway extends from the open, distal end of the trumpet 23 through the bottom of cup 22 and the neck 21 to the open, bottom end of the neck 21. A duckbill valve 30 (see FIG. 2) is provided between the cup 22 and the neck 21. The valve 30 is closed when the pressure in the cup 22 drops relative to the pressure in the neck 21 and opens when the pressure in the cup 22 rises to exceed the pressure in the neck 21.

The manual head 4 comprises a simple domed cover 6 and a lever 12. The domed cover 6 has skirts 6a on opposite sides that clip over respective radially extending flanges 22a on the cup 22 of the body 7. The lever 12 is for operating a diaphragm 25 mounted in the cup 22 of the body 7 and is configured to pivot on a fulcrum provided by a projection 22c rising from the back edge of the cup 22 of the body 7.

Further information regarding the operation of the manual head 4 in combination with the body 7 and a feeding bottle 5 can be obtained from EP-A-0733376.

Referring to FIG. 2, the diaphragm 25, received within the cup 22, is cup-shaped and formed from elastomeric material. The rim of the diaphragm 25 is turned back on itself to form a channel 27 which receives the rim of the cup 22 to secure the diaphragm in the cup 22.

Figure 3:
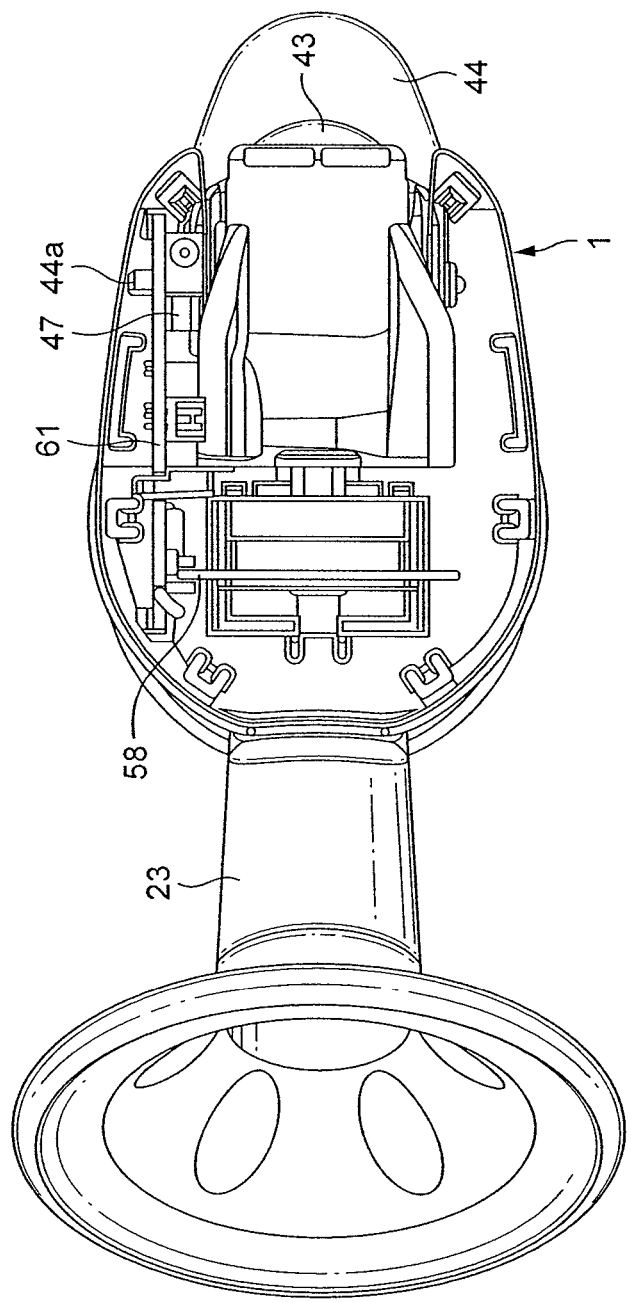
FIG. 3 is a top view of the powered head and part of a body with the head's cover removed.

Referring also to FIG. 3, the powered head 1 comprises a base 28, which is large enough to cover the interior of the diaphragm 25 and has an annular flange that fits tightly into the top of the diaphragm, a cover 32 is clipped over the base 28. The cover 32 has two skirts 32a (See FIG. 1) that clip over the radially extending flanges 22a on the cup 22.

An arm 43 and a lever 44 extend from the back of the housing 26, through a cut away in the cover 32. The overall form of the arm 43 and the lever 44 resembles that of the operating lever 12 of the manual head 4. The lever 44 has a longitudinal slot in its proximal end and the arm 43 extends along the slot 45, substantially filling it. The proximal end of the lever 44 is pivoted within the cover 32.

Figure 5:
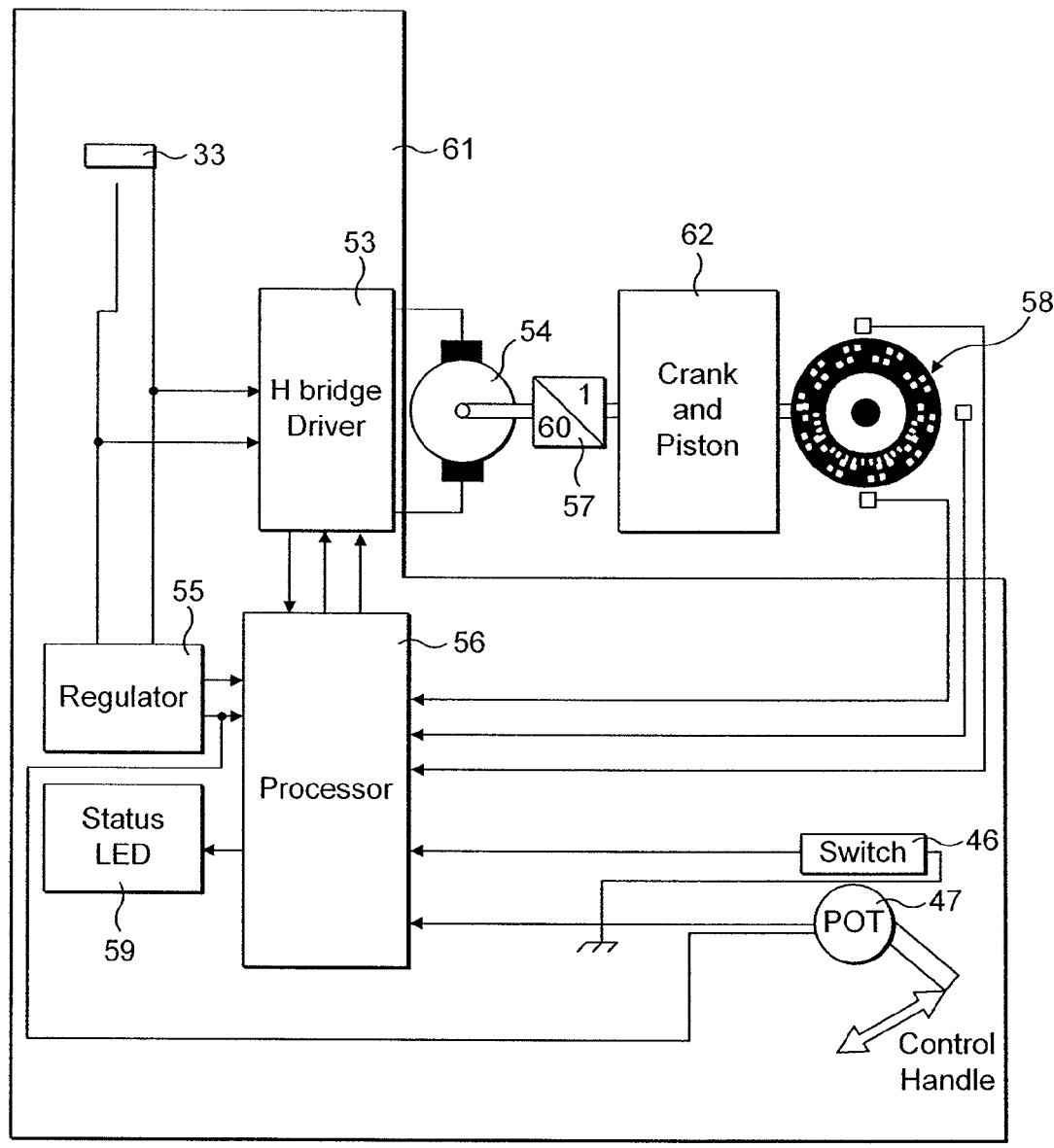
FIG. 5 is a block diagram of the powered head and its control system.

The arm 43 is pivotably mounted within the cover 32 so that pressing the arm 43 towards the cup 22 closes a switch 46 (see FIG. 5).

The lever 44 is biased outwards by a spring (not shown) within the cover 32.

Referring back to FIG. 1, the battery pack 2 can be carried in a pouch (not shown). The powered head 1 has a socket 33 which opens through the cover 32 and the battery pack 2 has a plug 34 which is received in the socket 33 to supply power to the powered head 1.

The mains PSU 3 is conventional and can be plugged directly into the socket 33 in the powered head 1 as an alternative to battery power. Also, the mains PSU 3 can be plugged into a socket 35 in the battery pack 2 for recharging batteries therein and power from the mains PSU 3 may be conveyed through the battery pack 2 to the powered head 1.

Figure 4:
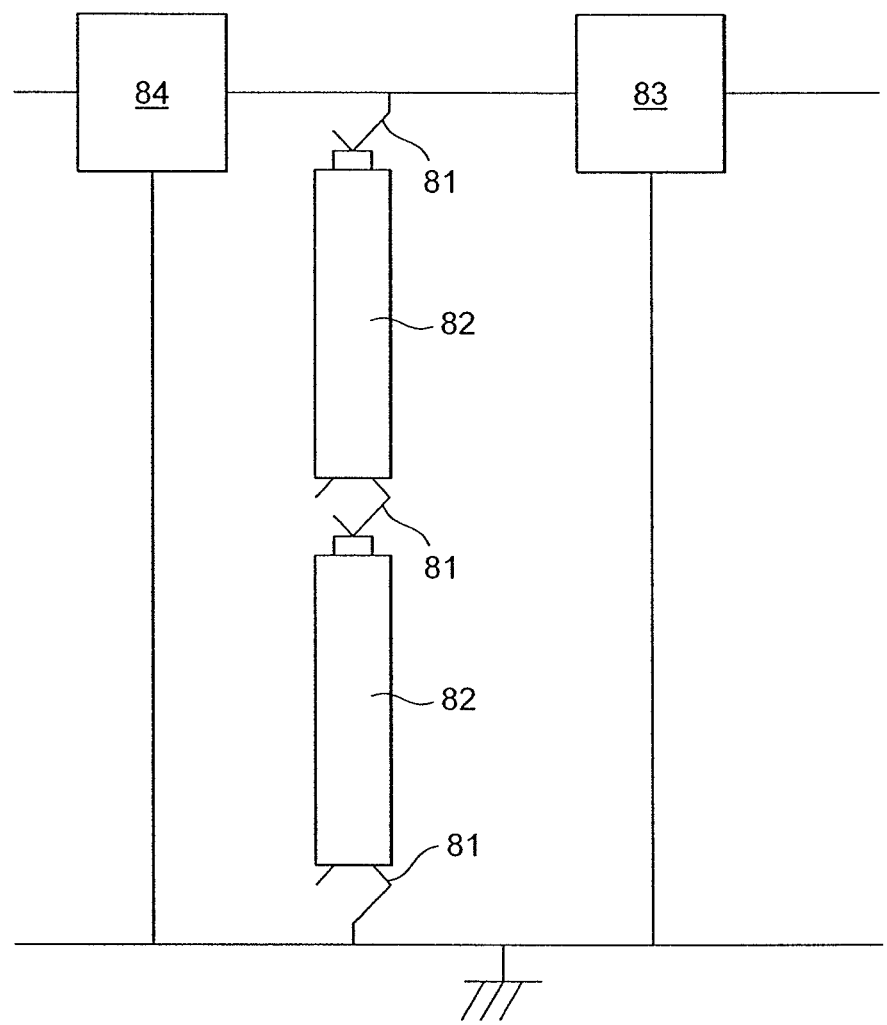
FIG. 4 is a block diagram of the battery pack in FIG. 1.

Referring to FIG. 4, the battery pack 2 includes terminals 81 for contacting batteries 82 (two shown but there may be more), a boost regulator 83 and a charging circuit 84. The use of the boost regulator 83 results in more consistent pump operation as the batteries 82 discharge.

Referring to back to FIGS. 2 and 3 and to FIG. 5, the powered head 1 houses a printed circuit board 61, which carries the unit's control circuit, a motor 54, a crank mechanism 62, a reduction gear 57 and a rotary encoder 58.

The power supplied through the socket 33 is provided to an H-bridge circuit 53, which provides power to the motor 54, and to a regulator 55. The regulated output of the regulator 55 powers the processing circuit 56, which is built around a microcontroller.

The motor 54 drives the crank mechanism 62 back and forth over a range of up to 180° via the reduction gear 57.

The crank mechanism 62 includes a connecting rod 63 which connects to a projection 64 from the diaphragm 25. The head of the projection 64 is formed into a flattened bulb.

Referring to FIGS. 6(a) to 6(c), the lower end 63a of connecting rod 63 has a semi-circular cross-section. A transverse slot 63b is formed a short distance from the bottom of the connecting rod 63 for receiving the bulb 64a at the top of the projection 64.

The powered head 1 is mounted to the cup 22 by aligning it with the cup 22 and pressing it into engagement. During this process, if the connecting rod 63 is at bottom dead centre, the bottom of the connecting rod 63 deflects the projection 64

(FIG. 6(b)) and when the bulb 64a of the projection 64 is aligned with the slot 63b in the connecting rod 63, the resilience of the diaphragm 25 moves the bulb 64a of the projection 64 into the slot 63b, returning the projection 64 to its upright position and drivingly coupling the connecting rod 63 and the projection 63 (FIG. 6(c)).

If the connecting rod 63 is not at bottom dead centre when the powered head 1 is mounted to the cup 1, the connecting rod 63 engages with the projection 64 as the connecting rod passes through bottom dead centre for the first time after the head 1 is mounted to the cup 22. In this case, as the connecting rod 63 passes through bottom dead centre, the bottom of the connecting rod 63 deflects the projection 64 (FIG. 6(b)) and when the bulb 64a of the projection 64 is aligned with the slot 63b in the connecting rod 63, the resilience of the diaphragm 25 moves the bulb 64a of the projection 64 into the slot 63b, returning the projection 64 to its upright position and drivingly coupling the connecting rod 63 and the projection 63 (FIG. 6(c)).

The resilience of the diaphragm 25 also allows the housing 26 to be pulled off the cup 22.

In contrast, the manual head 4 is mounted by engaging the projection 64 with a fork at one end of the operating lever 12 so that the bulb 64a of the projection 64 is above the fork, seating the lever 12 on its fulcrum and clipping on the cover 6. Thus, when the mounted operating lever 12 is operated by a user, the projection 64 is raised, taking with it the main part of the diaphragm 25. When the user releases the operating lever 12, the diaphragm 25 returns to its rest position.

Referring again to FIGS. 2, 3 and 5, when the powered head 1 is mounted on the cup 22, running of the motor 54 causes the crank mechanism 62 to raise and lower the diaphragm 25 and effect pumping. The position of the crank mechanism 62 is sensed by the rotary encoder 58.

A status LED 59 is controlled by an output from the control circuit 56 to provide feedback to the user. The light from the LED 59 is conducted from the printed circuit board 61 and to a lens 67 (see FIG. 1) by an optical waveguide (not shown) so that it can be seen by a user.

The switch 46 is coupled between an interrupt input of the processing circuit 56 and ground. The pivot arrangement of the lever 44 includes a stub 44a that passes through a preset-type potentiometer 47, mounted on the printed circuit board 61, so that the wiper of the potentiometer 47 moves when the lever 44 is pivoted. The potentiometer 47 is coupled between the positive voltage output of the regulator 55 and ground, and the wiper of the potentiometer 47 is connected to an analogue-to-digital converter input of the processing circuit 56.

The processing circuit 56 provides motor speed and direction signals to the H-bridge circuit 53 to control the movement of the motor 54.

The operation of the system will now be described.

Referring to FIG. 7, when the system is turned on, the processing circuit 56 determines whether the crank is in its home position by comparing the output of the rotary encoder 58 with a home reference value, i.e. 0 (step s1). If the crank mechanism 62 is not in its home position, the processing circuit performs an error checking routine and signals any errors using the status LED 59 (step s2) and halts the system.

The system enters "learn" mode by default. However, referring to FIG. 7, closing the switch 46 while the system is in "learn" mode switches it to "run" mode by setting a run mode flag (steps s101 and s102) and closing the switch 46 while the system is in "run" mode will switch it back to "learn" mode by resetting the run mode flag (steps s101 and s103).

In "learn" mode (step s3), the motor 54 is controlled by the processing circuit 56 in a simple servo loop (step s4). As the user presses the lever 44 towards the body 7, the wiper of the potentiometer 47 moves changing the output voltage of the potentiometer 47. This voltage is digitised and compared with the output of the rotary encoder and any error is used to generate control signal to drive the motor 56 so as to remove the error. Pressing the lever 44 causes the motor 54 to move the diaphragm 25 up and apply a sucking force in the breast receiving trumpet 23, and allowing the lever 44 to move towards its rest position causes the motor 54 to move the diaphragm 25 down, relieving the suction. Thus, the pressure in the trumpet 23 is set by the position of the lever 44 and the user can experiment by pressing and releasing the lever 44 until a comfortable and effective cycle has been discovered.

Referring to FIG. 9, during operation in the "learn" mode, the processing circuit 56 monitors the times of the start of each suctions stroke (ta), the end of each suction stroke (tb), the start of each relaxation stroke (tc) and the end of each relaxation stroke (td). The processing circuit 56 also monitors the start position (s) and lengths (d) of each suction stroke.

Referring to FIG. 10, at the end of the second and each subsequent relaxation stroke, i.e. at $td_n$, (step s201) the processing circuit 56 calculates the suction stroke velocity (i.e. d/(tb−ta)), the suction hold period, the relaxation stroke velocity (i.e. d/td−tc)) and the rest period of the previous cycle (if any) are calculated from the monitored times for the current and preceding cycles (step s202) and stored (step s203). The state of the run mode flag is then checked (step s204) and if the mode has changed to "run" mode, "learn" mode is left otherwise the process returns to step s101.

When the system is switched to "run" mode by the user closing the switch 46, the processing circuit 56 controls the motor 54 in accordance with the stored velocities and periods and the stored stroke and depth value.

Referring to FIGS. 7 and 11, if the system is determined to be in "run" mode (step s3), the processing circuit 56 determines whether the crankshaft is in the rest position, i.e. the suction stroke start position, (step s4) and, if it is not, outputs a stream of pulses to the H-bridge circuit 53, for setting the speed of the motor 54, and a direction signal so that the diaphragm 25 moves at the stored average suction velocity (step s5) until the rest position is reached. When the crankshaft is in the rest position (step s4), the processing circuit 56 begins to output a stream of motor speed control pulses to the H-bridge circuit 53 together with a forward signal for causing the motor 54 to run in a first direction (step s6). These pulses and the forward signal are output until the output of the rotary encoder 58 matches the sum of the rest position and the stored stroke depth value (step s7) at which time the motor is stopped (step s8). When the motor has been stopped, the processing circuit 56 does not output anymore speed control pulses until a period corresponding to the stored suction hold period has expired (step s9). When the suction hold period has expired (step s9), the processing circuit 56 outputs speed control pulses, corresponding to the stored average relaxation stroke velocity, to the H-bridge circuit 53 together with a reverse signal (step s9). These signals cause the motor to be driven in a second, opposite direction, allowing the diaphragm 25 to relax, and are terminated when the rotary encoder 58 indicates that the diaphragm 25 has returned to its rest position (steps s11 and s12). The processing circuit 56 does not then output any further motor control signals and when the stored average rest period has expired (step s13), it returns to step s3.

The system can be operated by a user in "learn" mode without switching to "run" mode. Thus, the system also provides a power-assisted breast pump which gives the user continuous control over the pumping cycle as with manual breast pumps but without the physical effort required by a manual breast pump.

It will be appreciated that the present invention can be implemented in other ways. For example, the "run" mode cycles could follow the "learn" mode cycle with greater fidelity. This could be achieved by recording the position of the crankshaft at a plurality of instants during each stroke in "learn" mode. The "run" mode cycle could be established by taking averages of cycle parameters obtained from a plurality of learn mode cycles. For convenience, the user input means mimics the actuator of a manual breast pump. This arrangement could be replaced by a foot switch and pedal rather like that of a sewing machine or a separate handheld control unit. The user inputs may be communicated to the processing circuit wirelessly, e.g. using IR.

An alternative to the suction start parameter and stroke length parameter combination would be a rest position parameter and suction hold position parameter.

A second embodiment is electrically the same as the first embodiment described above but is physically configured for use on the body 107 of a Medela® Harmony manual breast pump.

Referring to FIGS. 12 and 13, a second powered head 101 comprises a base 128, which includes a pumping chamber 122 containing a diaphragm 125, a chassis 126 mounted to the base 128 and a cover 132 that encompasses the base 128 and the chassis 126. The cover 132 has a pair of cheek pieces 132a that clip around the root of the trumpet 123 of the breast pump body 107 to hold the powered head 101 in place. A tube 130 projects from the bottom of the base 128 for insertion into a corresponding hole in the breast pump body 107. The upper end of the tube 130 opens into the pumping chamber 122.

An arm 143 and a lever 144 extend from the back of the housing 126, through a cut away in the cover 132. The overall form of the arm 143 and the lever 144 resembles the operating lever 12 of the manual head 4, described above. The lever 144 has a longitudinal slot 145 in its proximal end and the arm 143 extends along the slot 145, substantially filling it. The proximal end of the lever 144 is pivoted within the cover 132.

The arm 143 is pivotably mounted within the cover 132 so that pressing the arm 143 towards the breast pump body 107 closes a switch 46 (see FIG. 5).

The lever 144 is biased outwards by a spring (not shown) within the cover 132 and is drivingly coupled to the wiper of the potentiometer 47 (see also FIG. 5).

The powered head 101 houses a printed circuit board 161, which carries the unit's control circuit, a motor 154, a crank mechanism 162, a reduction gear 157 and a rotary encoder 158.

The motor 154 drives the crank mechanism 162 back and forth over a range of up to 180° via the reduction gear 157.

The crank mechanism 162 includes a connecting rod 163 which connects to a projection 164 from the diaphragm 125.

The operation of the second powered head 101 for expressing milk is the same as the operation of the first powered head 1 described above.

It will be appreciated that many modifications may be made to the embodiments described above. For example, the diaphragm could be replaced by a rigid piston or be inverted with the motor driving the periphery of the diaphragm up and down. As mentioned above, a lead screw mechanism can be used to drive the piston or diaphragm. The need for a crank mechanism, a screw mechanism or any other rotary to linear motion conversion mechanism can be avoided by use of linear motor instead of the rotary motor described above.

The invention claimed is:

1. A hand held breast pump system comprising:
   a body having
      a trumpet to receive a breast,
      a neck connected to the trumpet to receive expressed breast milk from the trumpet, and
      a pumping chamber between the trumpet and the neck;
   a piston operable in the pumping chamber;
   a diaphragm for sealing off the chamber from the trumpet and the neck;
   a valve for dosing the neck to restrict flow of milk from the trumpet and opening the neck to allow the flow of milk from the trumpet when pressure in the chamber is above pressure in the neck; and
   a drive selected from at least one of interchangeable manual and motorized units for removably connecting to the body and the diaphragm and reciprocally driving the diaphragm when brought into contact therewith to vary the pressure in the chamber, wherein the diaphragm includes an actuating element for effecting pumping, the at least one of interchangeable manual and motorized units for reciprocally driving the piston, and the drive is configured to connect to said actuating element when brought into contact therewith.

2. The hand held breast pump system according to claim 1, wherein each drive includes a respective pumping chamber.

3. The hand held breast pump system according to claim 1, wherein the drive connects to said actuating element during the process of mounting the motor unit to the body.

4. The hand held breast pump system according to claim 1, wherein the drive connects to said actuating element while being driven.

5. The hand held breast pump system according to claim 1, wherein the drive is a crank mechanism and includes a rod and said connection to said actuating element is effected by relative resilient deflection and recovery between the rod and said actuating element.

6. The hand held breast pump system according to claim 5, wherein the actuating element is a resiliently deflectable projection projecting from the piston.

7. The hand held breast pump system according to claim 6, wherein the projection has a bulge and the rod includes a connector for receiving said bulge so as to couple the rod and the projection.

8. The hand held breast pump system according to claim 7, wherein the rod has a coupling portion shaped to surround the projection partially and the connector comprises a recess or slot in said coupling portion.

9. The hand held breast pump system according to claim 1, wherein the diaphragm is made of resilient material.

10. The hand held breast pump system according to claim 9, wherein: the drive comprises a crank mechanism and a rod; the actuating element projects from the diaphragm; and the rod is configured such that said connection to said actuating element is effected by the actuating element first being deflected and then recovering, due to the resilience of the diaphragm.

11. The hand held breast pump system according to claim 1, wherein the drive is a motorized unit, the system further including a control circuit configured to effect pumping by alternating a direction of a motor of the motorized unit.

12. The hand held breast pump system according to claim 1, wherein the drive is a motorized unit wherein the motorized unit is battery-powered.

13. The hand held breast pump system according to claim 12, further including a boost regulator for regulating the voltage supplied to a motor of the motorized unit.

* * * * *